United States Patent [19]

Gimmler et al.

[11] Patent Number: 5,440,602

[45] Date of Patent: Aug. 8, 1995

[54] METHOD AND DEVICE FOR COUNTING CLOCK PULSES FOR MEASURING PERIOD LENGTH

[75] Inventors: Helmut Gimmler, Waiblingen; Ulrich Nester, Neuhausen; Dinh D. Tu, Plattenhardt, all of Germany

[73] Assignee: Daimler-Benz AG, Stuttgart, Germany

[21] Appl. No.: 234,155

[22] Filed: Apr. 28, 1994

[30] Foreign Application Priority Data

Apr. 27, 1993 [DE] Germany .................. 43 13 780.6

[51] Int. Cl.$^6$ .............................................. G01F 15/00
[52] U.S. Cl. ................................................. 377/20
[58] Field of Search ........................................ 377/20

[56] References Cited

U.S. PATENT DOCUMENTS

| | | | |
|---|---|---|---|
| 4,695,781 | 9/1987 | Ito | 318/603 |
| 5,323,436 | 6/1994 | Lee | 377/20 |
| 5,333,162 | 7/1994 | Condreva | 377/20 |

FOREIGN PATENT DOCUMENTS 1603956 12/1981 United Kingdom .

*Primary Examiner*—Margaret Rose Wambach
*Attorney, Agent, or Firm*—Evenson, McKeown, Edwards & Lenahan

[57] ABSTRACT

Method and device for counting clock pulses for the purpose of determining period length works in accordance with an absolute time measuring principle, provides at least a single main counter which runs uninterruptedly from the start of measurement to the end of measurement and a channel counter for each of a number n of measuring channels. By stopping a channel counter at the associated measurement period end and reading out the counter reading thereof as well as that of a supplementary upper main counter part which contains the higher-order count positions, a determination is made of the total time elapsed from the start of measurement up to the respective detected period end, and thereafter the target period lengths are determined by forming the difference of successive count values. The invention can be used, for example, for the high-precision measurement of the speed of a system rotating about an axis.

9 Claims, 1 Drawing Sheet

METHOD AND DEVICE FOR COUNTING CLOCK PULSES FOR MEASURING PERIOD LENGTH

BACKGROUND AND SUMMARY OF THE INVENTION

The invention relates to a method and a device for counting clock pulses for the purpose of measuring period lengths which occur in one or more measuring channels arranged in parallel.

Such a method is used, for example, for the high-precision measurement of the speed characteristic of shafts and wheels of driving or driven systems. In this case, a co-rotating device, for example a toothed wheel or an optical pulse disc, is provided on which incremental marks are arranged at an equidistant angular spacing. The incremental marks pass by a sensor head and cause measurement events there, for example the transition from optical transparency to opacity and vice versa in the case of an optical pulse disc, the temporal spacing of which events is a measure of the rotational angle of the rotating system. It is possible in this way to determine the speed via a period length measurement by counting temporally equidistant clock pulses during a respective period situated between two such events. Such pulse counting is performed in one or more measuring channels each of which is assigned a specific period length sequence. Thus, a measuring channel corresponds to each disc track in the case of an optical pulse disc.

The period lengths can vary between very high values, corresponding to a very slowly rotating system, and very small values, corresponding to a very quickly rotating system. If period lengths within a large range of values are to be detected, resolving short period lengths requires the use of a high reference clock frequency for the clock pulses, which can be over 10 MHz, for example, while detecting long period lengths, a correspondingly high counting capacity for the pulse counting is required. If one individual, separate counter is provided per measuring channel, this counter is therefore to be dimensioned appropriately large, that is to say its counting capacity must cover the longest period to be expected. In the case of high clock frequencies, the readout time required for such a counter can become larger than the spacing between two clock pulses. In order not to lose any pulses, which could give rise to measurement errors, it is known to arrange two similar channel counters per measuring channel in each case. Of these, one is respectively in counting operation during a period while the other is stopped, and its value is stored in an associated register and thereupon said counter is reset to zero and restarted at the beginning of the next period. At the end of one period and the simultaneous start of the next period, the active counting functions of the two counters alternate correspondingly. It is therefore necessary in this mode of procedure either to provide two counters per measuring channel with a counting capacity adapted to the longest period to be expected, or else to provide prescaling of the reference clock frequency. The first solution necessitates a corresponding outlay on components, and the second solution can impair the measurement accuracy, and leads to complicated and error-rife case discriminations in the evaluation of measured data.

The known period measurement by means of pulse counting using two alternating counters per measuring channel is a relative time measurement, that is to say the absolute time from the start of measurement is yielded by summing all the measured individual period lengths of a measuring channel, as a result of which there is the risk that individual errors are likewise summed, and this can be attended by the loss of a correct time reference between different measuring channels.

An object of the present invention is to provide a method and a device for counting clock pulses which in conjunction with a low outlay on components permits error-free measurement even of comparatively long period lengths in simultaneous conjunction with a high temporal resolution for comparatively short period lengths.

This and other objects are achieved by the present invention which provides a method for counting clock pulses for measuring period lengths in a number n of measuring channels with n greater than or equal to one, during a prescribed measurement period, comprising the steps:

a) simultaneously starting, at a start of measurement, of $m_i$-digit channel counters separately provided for each measuring channel, and an h-digit main counter, h being greater than all the $m_i$, b) upon occurrence of a period end in one of the measuring channels, stopping the channel counter of that measuring channel and reading out $m_j$ count positions from that channel counter, reading out h-$m_j$ higher-order count positions of the main counter and forming an L-digit total count value, which combines the two read-out count positions and represents a temporal spacing of said period end from the start of measurement, c) after readout of the channel counter, starting this channel counter again and synchronized with the $m_j$ lower-value count positions of the main counter, which have continued to run, d) repeating steps b) and c) up to a specifiable measurement period end, and e) respectively determining the number of counting pulses which has occurred between the start and the end of each period of each measuring channel and is representative of the respective period length, by subtracting the count value belonging to the period start from the count value belonging to the period end for each period.

The present invention has the advantage that only a single channel counter and a main counter common to all the channels are required per measuring channel. The low outlay on components is the more effective the more measuring channels are present. A high clock frequency can be used for the purpose of period length measurement, since the main counter continues to count uninterruptedly. By stopping the associated channel counter at the end of each period within a measuring channel and reading out the value counted by this counter as well as reading out the higher-order count position part of the main counter, the absolute duration of the time elapsed from the start of measurement up to this period end is detected in each case, and the respective period length is determined by forming the difference of two successive count values.

The lower-order count position part, corresponding in its counting capacity to the respective channel counter, therefore does not need to be stopped, since the corresponding counting result is taken from the channel counter and is therefore able to count further even during a readout operation of a channel counter and of the higher-order count position part of the main counter. Consequently, even the clock pulses occurring during a readout operation, which by their nature have a stronger effect in changing a count position the lower the order of the count position, can be detected without gaps, that is to say counted. This permits the use of clock frequencies which the time intervals of the pulses are smaller than the time required to read out the counter, without there being a need to provide for each counting channel two channel counters or in each case a large channel counter corresponding in capacity to the existing main counter.

In certain embodiments of the invention, there are arranged, for a higher-order count position part of the main counter and for each channel counter, registers in which the existing count value is stored at the period end in order for it to be read out from there for further processing, for example in a computer.

In certain embodiments of the invention, each measuring channel is additionally assigned a carry counter and a register therefor, the carry counter needing to have only a very low counting capacity, that is to say one or a few count positions. Its count positions adjoin the highest-order count position of the respective channel counter and to this extent overlap with the lower-order range of the higher-order count position part of the main counter. When such carry counters are arranged, a correct count value is obtained even if one or more of the channel counters should overflow in the meantime during reading out of a count value, previously obtained and stored in the main counter register, from this register. Each such overflowing of a channel counter then results in an increase by one in the count value in the assigned carry counter.

The main counter is to be at least so large that it can count all the pulses occurring within a period of maximum length, while the channel counters together with optionally provided carry counters must be so large that they are able to detect the pulse number during the readout time for all active channels by means of a control computer. This guarantees in satisfying a real-time condition for readout that no readout errors occur even in the most unfavorable case in which in each case an immediately adjacent channel and carry counter stops shortly before the end of the readout operation for a preceding measuring channel and is due for readout. It is preferred for all the carry counters to be reset jointly to zero after the end of such a readout chain, but it is also possible to reset each carry counter separately after its readout.

In certain embodiments of the invention, the main counter is so large that it can count all the pulses occurring within the total measurement period, and the channel is dimensioned together with the carry counters in such a way that they are able to count a period of maximum length occurring in the respective measuring channel. This permits continuous measurement of absolute time during the total measurement period without additional software measures, and this overcomes the difficulties of the known relative time measurement.

In the known relative time measurement the juxtaposition of the individual period lengths means that even a single occurrence of a stochastic error, for example a peak on the measurement signal, leads to shifting of all the following measured values on the time axis, which in the case of multichannel measurements of period lengths or in the case of a measurement, carried out in parallel, of other physical quantities, for example a pressure or torque, leads to a loss of the mutual time reference between the measuring channels. By contrast, the absolute time measurement according to the present invention has the further advantage that only the time reference of the defective measured value is lost, whereas the time reference of all of the following measured values is retained, and this permits the mutual temporal assignment.

Furthermore, in the known relative time measurement using two counters per measuring channel, switching over between these could lead to inaccuracies in counting the reference frequency, which add up given the juxtaposition of the individual period lengths to form the time characteristic of the entire measurement operation. The absolute time measurement of the present invention, with the continuously counting, nonstop main counter avoids this potential source of error.

In addition, during an operation with essentially similar period lengths it is possible with this absolute time measurement for missing measured values due to stochastic errors, for example in the case of storage of count values, to be detected as outliers which have approximately double the period length, whereas in the known relative time measurement such errors likewise cannot be detected in normal operation.

Other objects, advantages and novel features of the present invention will become apparent from the following detailed description of the invention when considered in conjunction with the accompanying drawings.

DETAILED DESCRIPTION OF THE DRAWINGS

Figure 1:
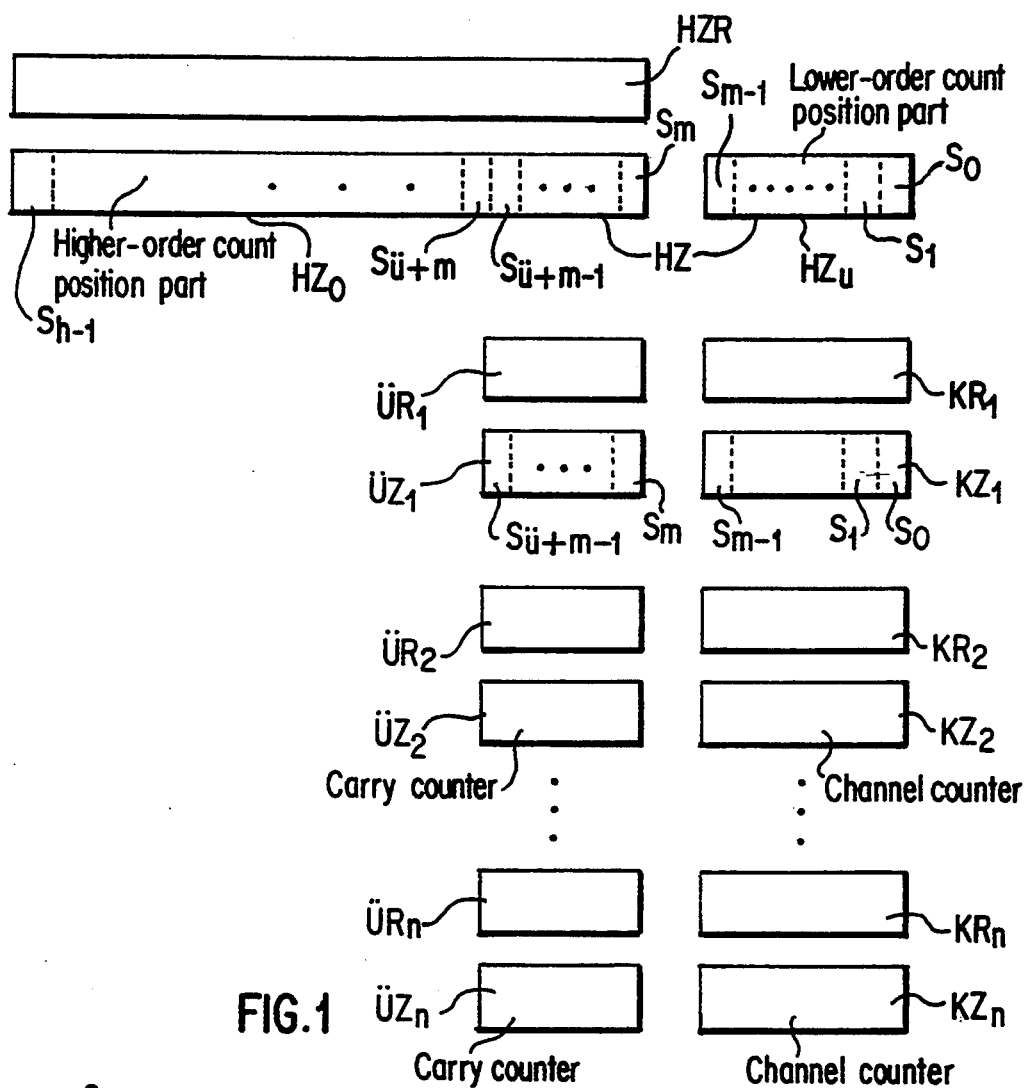
FIG. 1 shows a block diagram of a device for multi channel counting of clock pulses, construed in accordance with an embodiment of the present invention.
Figure 2:
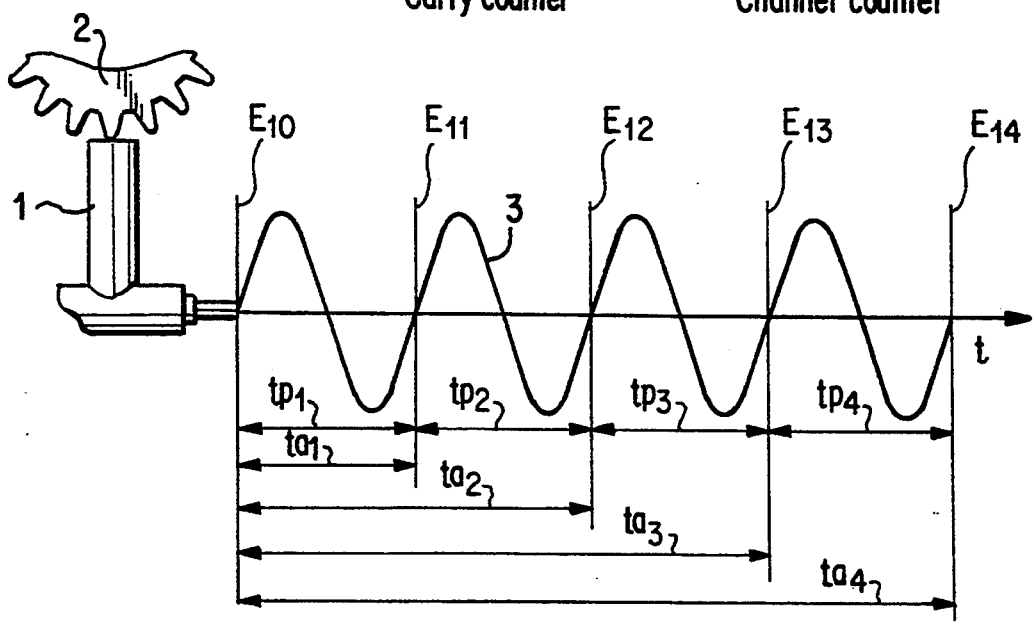
FIG. 2 shows a diagrammatic representation of a speed measuring device and of the measurement signal generated by it.

In the illustrated exemplary embodiment of the present invention, the counting device in FIG. 1 is used to determine period lengths of an incremental mark speed measuring device as represented in FIG. 2. A toothed wheel (2), of which only a detail is shown and on which a measuring head (1) is arranged, is provided as the incremental mark device. The measuring head (1) supplies a measurement signal (3) whose time-dependent amplitude characteristic is shown diagrammatically in FIG. 2, in a graph. In order to determine the speed of an element, which is not shown in more detail and rotates with the toothed wheel (2), the respective period lengths ($tp_1$, $tp_2$, ...) are detected, one period corresponding to the rotational angle spacing of two teeth of the toothed wheel (2). The instant ($E_{10}$, $E_{11}$, ...) of the positive zero crossing of the measurement signal (3) is selected in each case as the beginning or end of a period. The period lengths ($tp_1$, ...) are determined for their part due to the fact that the pulses of a reference clock source, which occur respectively during a period length, are counted by the counting device of FIG. 1, which is described in more detail below. For this purpose, it is preferable to use clock frequencies of 10 MHz or higher for a high precision speed measurement.

The counting device in FIG. 1 has one m-digit channel counter ($KZ_1$, ..., $KZ_n$), that is to say $m_i 32$ m for all i from 1 to n, for each of a number n of measuring channels. The counting device also has a singler h-digit main counter (HZ), which is divided symbolically in FIG. 1 into a lower main part, (lower-order count position part) (HZu) and an upper main part, (higher-value count position part) (HZo). The lower part (HZu) forms an m-digit counter part having a lowest-order count position $s_0$ and adjoining count positions $s_1$ to $s_{m-1}$, and thus corresponds to the similarly dimensioned m-digit channel counters ($KZ_1, \ldots KZ_n$). Moreover, the counting device of FIG. 1 in each case comprises a carry counter ($ÜZ_n, \ldots, ÜZ_n$) for each of the n measuring channels. These carry counters ($Z_1$ to $UZ_n$) are of e,uml u$\times$-digit design in each case and adjoin the highest-order count position ($s_{m-1}$) of the channel counters ($KZ_1$ to $KZ_n$), with the result that they overlap with the ü lower-order count positions ($s_m$ to $s_{ü+m-1}$) of the upper main counter part (HZo) of the main counter (HZ).

All the counters are binary counters, since their outputs signals are particularly suitable for further processing inside a computer, so that, for example, the maximum count value of the m-digit channel counters ($KZ_1$ to $KZ_n$) is in each case $2^m-1$ and that of the h-digit main counter (HZ) is $2^h-1$. Depending on the application, however, it is also possible, of course, to use counters having more than two possible states per count position.

The channel counters ($KZ_1$ to $KZ_n$), the carry counters ($ÜZ_1$ to $ÜZ_n$) and the upper main counter part (HZo) are each assigned a dedicated register ($KR_1$ to $KR_n$), ($ÜR_1$ to $ÜR_n$) and (HZR), in which count values can be intermediately stored and thereafter spread out therefrom.

The functioning of the counting device is explained below firstly in connection with the single channel speed measuring arrangement according to FIG. 2 and the measurement signal graph represented there. The use of the main counter (HZ) and of the first channel counter ($KZ_1$) as well as of their associated registers (HZR, $KR_1$) suffice to detect the single-channel measurement signal (3) represented.

At the start of measurement at the instant ($E_{10}$), the two counters (HZ, $KZ_1$) are simultaneously started from the value of zero in order to count clock pulses of a reference clock source (not shown). At the instant ($E_{11}$), the end of a period is detected in the first measuring channel which in this example is the only active one and the channel counter ($KZ_1$) is stopped. Its value is intermediately stored in the assigned channel counter register ($KR_1$). The value of the higher-order main counter part (HZo) is likewise stored in the main counter register (HZR). In this embodiment, storage of the respective current count values is performed continuously, but it is also possible not to undertake storage in each case until the detection of stopped counters. These registers ($KR_1$, HZR) are subsequently read out by a control computer (not shown). The two count values read out are recombined in the computer to form a total count value whose m lower-order digits result from the channel counter ($KZ_1$) and whose h-m higher-order digits result from the upper main counter part (HZo), and which represent a measure of the period of time ($ta_1$) which has elapsed between the start of measurement at the instant ($E_{10}$) and the end of the first measurement period at the instant ($E_{11}$). After storage of the count value of the stopped channel counter ($KZ_1$) in its register ($KR_1$), this channel counter ($KZ_1$) is reactivated and synchronized with the counter reading of the lower main counter part (HZu), which has not been stopped, with the result that this channel counter ($KZ_1$) again recovers the counting pulses possibly occurring in the meantime and otherwise lost by the stoppage of the channel counter ($KZ_1$).

If at a later instant ($E_{12}$) the end of the next measurement period is detected in this first measuring channel, the procedure described above for the instant ($E_{11}$) is repeated, that is to say the associated channel counter ($KZ_1$) is stopped and its counter reading and that of the upper main counter part (HZo) are stored in their respective registers ($KR_1$, HZR) and read out from there, after which the channel counter ($KZ_1$) is reactivated and synchronized with the lower main counter part (HZu). The total count value then determined corresponds to the time ($ta_2$) which has elapsed from the instant ($E_{10}$) of the start of measurement up to the instant ($E_{12}$) of the measurement period end now detected.

This results in a sequence of time periods $ta_1, ta_2, \ldots$, which is represented by the sequential count values for a measuring channel and corresponds to the temporal spacing of a respective measurement period end ($E_{1i}$, $i=1, 2, \ldots$) from the start of measurement ($E_{10}$), as follows from the graph part of FIG. 2. It is now possible from this to use the control computer to determine the individual target period lengths ($tp_1, tp_2, \ldots$) by subtracting the preceding total count value from a subsequent total count value. The count value resulting therefrom clearly corresponds to the length of the measurement period between the two instants that belong to these total count values. At the same time, this type of measurement of the absolute time intervals ($ta_1, ta_2$ etc.) from the start of measurement preserves the information on the temporal relationship to period characteristics on other measuring channels and/or measurements, carried out simultaneously, of other magnitudes such as, for example, a measurement of pressure or torque. In this type of absolute time measurement, in which the main counter carries on counting from the start of measurement up to the end of measurement without interruption, there is no occurrence of errors as in the known relative time measurement of respectively the individual period lengths ($tp_1, tp_2$, etc.) and their subsequent joining together. Such errors can be produced due to an accumulation of individual errors in the time determination of an individual measurement period.

If the measuring device has further measuring channels, for example in the use of a plurality of mutually independent incremental mark toothed wheels or of a multitrack optical pulse disc in an arrangement otherwise similar to FIG. 2, these further measuring channels are assigned by the counting device of FIG. 1 in each case a further channel counter ($KZ_i$, $i=2, \ldots$) and an associated channel counter register ($KR_i$). Whenever in one of the measuring channels a period end is detected, the associated channel counter is stopped and, just like that of the upper main counter part (HZo), its counter value is stored in the associated register and subsequently read out, while the main counter (HZ) and the remaining channel counters continue to run. Thereafter, the previously stopped channel counter is synchronized again with the lower main counterpart (HZu) and thus also with the remaining channel counters, which all count the same time.

Clearly, the invention produces a considerable saving in components, particularly for a large number of measuring channels, since there is a need to provide only a single large main counter and, for each measuring channel, only a single channel counter.

For multichannel applications, it is very expedient to arrange respectively one carry counter ($\text{ÜZ}_1, \ldots, \text{ÜZ}_n$) per measuring channel and one respectively assigned carry counter register ($\text{ÜR}_1, \ldots, \text{ÜR}_n$), such as the counting device shown in FIG. 1 has. To be specific, as long as the main counter register (HZR) has not yet been read out, it is necessary to prevent the same from being overwritten. Such an overwrite request can result from the fact that during the readout operation of a count value belonging to a previously determined period end of one measuring channel, a period end is likewise detected shortly thereafter in another measuring channel, and this requires the detection of the associated new count value. However, during the readout operation storage of new values in the main storage register (HZR) is blocked in order not to falsify the count value to be read out. There can be a change in the count value in the upper main counter register part (HZo) that occurred between the previously detected period end of the one measuring channel and the newly detected period end of the other measuring channel, for example a change in the value of the lowest-order count position ($s_m$) of this upper main counter part (HZo) due to a running full or overrunning of the lower main counter part (HZu) and, synchronous therewith, of the channel counters ($\text{KZ}_1$ to $\text{KZ}_n$) with the exception of the stopped channel counter. In this case, the protection against storing the value of the upper main counter part (HZo) in the main counter register (HZR) could lead to a defective determination of the count value for the newly detected period end, since the intermediate change in counter reading of the upper main counter part (HZo) would not be detected. This potential problem is prevented by the carry counters ($\text{ÜZ}_1$ to $\text{ÜZ}_n$) provided by the present invention. Their ü count positions adjoin the highest-order count position ($s_{m-1}$) of the respective channel counter. In this case, their count position number ü is preferably substantially smaller than the count position number m of the channel counters. In simple variant embodiments, a respectively single-digit carry counter, that is to say ü=1, is sufficient in itself.

If during a readout operation one of the channel counters which has not been stopped overruns, and in association therewith the counter reading of the upper main counter part (HZo) changes, this information is not lost but is retained as a change in the counter reading of the assigned carry counter. If a period end is subsequently detected in such a measuring channel, the channel counter and the carry counter of this measuring channel are stopped and the counter readings are stored in their assigned registers. The carry counter of all the measuring channels are reset again to zero as soon as the blockage which prevents storage of the upper main counter part (HZo) in the associated register (HZR) during the readout operation is removed. This blockage is terminated when all the channel and carry counters which correspond to the previous state of the upper main counter part (HZo) have been read out by the control computer. In addition, the channel counters are synchronized again with the lower main counter part (HZu). In order to obtain the correct total count value belonging to the detected period end, the control computer adds the count value coming from the carry counter to the count value coming from the main counter register (HZR) and subsequently combines this in turn with the counter reading from the associated channel counter register.

The arrangement of tile carry counters is favorable in particular in the case of a large number of measuring channels, since readout operations are to be sequentially carried out correspondingly frequently in different measuring channels, while the latter are respectively blocked from storing the current counter reading of the upper main counter part (HZo). Carry and channel counters are to be designed together such that the maximum channel-specific count value they can achieve is just greater than the product of the number of the channels, the readout time for a channel and the frequency of the reference clock pulse, in order to ensure an error-free determination of all the period-end count values.

Modifications of the exemplary embodiment to fit a particular application are possible within the scope of the invention. Thus, only a portion of the measuring channels can be fitted with carry counters, or channel counters can be provided with a different count position number $m_i$, the control computer then determining the higher-order, upper main counter part, which can then be selected differently for different channel counters, in order to determine the respective total count value.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Method for counting clock pulses for measuring period lengths in a number n of measuring period lengths in a number n of measuring channels with n greater than or equal to one, during a prescribed measurement period, comprising the steps:

a) simultaneously starting, at a start of measurement ($E_{i0}$; 1,...,n), of $m_i$-digit channel counters ($\text{KZ}_i$) separately provided for each measuring channel, and an h-digit main counter (HZ), h being greater than all the $m_i$, b) upon occurrence of a period end ($E_{jk}$; k=1, 2,...) in one (j) of the measuring channels, stopping the channel counter ($\text{KZ}_i$) of that measuring channel and reading out $m_j$ count positions from that channel counter, reading out h-$m_j$ higher-order count positions of the main counter (HZ) and forming an h-digit total count value, which combines the two read-out count positions and represents a temporal spacing of said period end from the start ($E_{j0}$) of measurement, c) after readout of the channel counter ($\text{KZ}_j$), starting this channel counter again and synchronized with the $m_j$ lower-value count positions of the main counter (HZ), which have continued to run, d) repeating steps b) and c) up to a specifiable measurement period end, and e) respectively determining the number of counting pulses which has occurred between the start ($E_{jk-1}$) and the end ($E_{jk}$) of each period (k; k=1, 2, ...) of each measuring channel (i; i=1, ...,n) and is representative of the respective period length, by substracting the count value belonging to the period start ($E_{jk-1}$) from the count value belonging to the period end ($E_{jk}$) for each period.

2. Method according to claim 1, further comprising intermediately storing in registers $\text{KR}_i$; i=1, 2...n; HZR) respectively provided therefor the counter values, which are to be read out, of the channel counters ($\text{KZ}_i$), which all have the same number m of count positions, and the h-m higher-order count positions of the main counter (HZ).

3. Method according to claim 2, wherein during a readout operation initiated before the occurrence of a period end in one of at least two measuring channels provided, protecting the main counter register (HZR) against an overwrite which results from an intermediate storage request caused in one of the other measuring channels by the occurrence of a later-occurring period end, and during this readout operation, producing a carry for the measuring channel of the later-occurring period end after the channel counter has reached the maximum count value is detected by a respectively u-digit carry counter ($UZ_i$; i=1, 2, . . . .n) which is separately provided for each channel and overlaps with the u-lower-order count positions of the upper main counter part ($HZ_0$) formed from the h-m higher-order count positions, upon the occurrence of the later period end, stopping the associated carry counter with the channel counter, intermediately storing a count value of the carry counter in a respectively assigned carry counter register ($UR_i$; i=1, 2, . . . .n) and adding the count value of the carry counter to a previous value of the main counter register (HZR) in order to obtain the count value belonging to said period end.

4. Method according to claim 3, wherein after the end of the protection, determined by the readout time, of the main counter register against an overwrite by the upper main counter part, further comprising the step of jointly resetting the carry counters to zero.

5. Method according to claim 4, wherein a respective maximum pulse number which can be detected by the channel counters together with the carry counters is at least as large as a pulse number occurring in a period of maximum length, and a maximum pulse number which can be detected by the main counter is at least as large as a pulse number occurring overall during the total measurement period, which comprises the individual period lengths.

6. Method according to claim 3, wherein a respective maximum pulse number which can be detected by the channel counters together with the carry counters is an least as large as a pulse number occurring in a period of maximum length, and a maximum pulse number which can be detected by the main counter is at least as large as a pulse number occurring overall during the total measurement period, which comprises the individual period lengths.

7. Device for counting clock pulses for measuring period lengths in a number n of measuring period lengths in a number n of measuring channels with n greater than or equal to one, during a prescribed measurement period, in which the device a) simultaneously starts, at a start of measurement, $m_i$-digit channel counters ($KZ_i$) separately provided for each measuring channel, and an h-digit main counter (HZ), h being greater than all the $m_i$; and b) upon occurrence of a period end in one of the measuring channels, stops the channel counter of that measuring channel and reads out $m_j$ count positions from that channel counter, reads out h-$m_j$ higher-order count positions of the main counter and forms an h-digit total count value, which combines the two read-out count positions and represents a temporal spacing of said period end from the start of measurement; and c) after readout of the channel counter, starts this channel counter again and synchronized with the $m_j$ lower-value count positions of the main counter, which have continued to run; and d) repeats steps b) and c) up to a specifiable measurement period end, and e) respectively determines the number of counting pulses which has occurred between the start and the end of each period of each measuring channel and is representative of the respective period length, by subtracting the count value belonging to the period start from the count value belonging to the period end for each period; wherein the main counter (HZ) of the device has a number h of count positions, and the channel counters ($KZ_i$) have a respective number $m_i$ of count positions, all the $m_i$ being smaller than h and each of the n measuring channels being assigned a channel counter.

8. Device according to claim 7, wherein all the channel counters ($KZ_i$) have the same number m of count positions, and further comprising registers ($KR_i$; i=1, . . . .n), with one said register respectively assigned to one of said channel counters and to the upper main counter part ($HZ_0$), wherein the registers consist of the h-m higher-order count positions of the main counter (HZ), in order to store count values produced there.

9. Device according to claim 8, wherein a carry counter ($UZ_i$; i=1, . . . .n) and an assigned register ($UR_i$; i=1, . . . .n) is provided additionally for each measuring channel.

* * * * *